United States Patent
Okutani et al.

(10) Patent No.: US 11,676,834 B2
(45) Date of Patent: Jun. 13, 2023

(54) SUBSTRATE PROCESSING METHOD AND SUBSTRATE PROCESSING APPARATUS

(71) Applicant: SCREEN Holdings Co., Ltd., Kyoto (JP)

(72) Inventors: Manabu Okutani, Kyoto (JP); Tsutomu Osuka, Kyoto (JP); Katsuei Higashi, Kyoto (JP); Hiroshi Abe, Kyoto (JP); Naohiko Yoshihara, Kyoto (JP)

(73) Assignee: SCREEN Holdings Co., Ltd.

( * ) Notice: Subject to any disclaimer, the term of this patent is extended or adjusted under 35 U.S.C. 154(b) by 406 days.

(21) Appl. No.: 16/727,993

(22) Filed: Dec. 27, 2019

(65) Prior Publication Data
US 2020/0243350 A1    Jul. 30, 2020

(30) Foreign Application Priority Data
Jan. 28, 2019   (JP) .............................. JP2019-012311

(51) Int. Cl.
H01L 21/67    (2006.01)

(52) U.S. Cl.
CPC ...... *H01L 21/6715* (2013.01); *H01L 21/6708* (2013.01); *H01L 21/67051* (2013.01); *H01L 21/67098* (2013.01)

(58) Field of Classification Search
CPC ......... H01L 21/67028; H01L 21/02041; H01L 21/67103; H01L 21/67253;
(Continued)

(56) References Cited

U.S. PATENT DOCUMENTS

| 2014/0127908 A1* | 5/2014 | Okutani ............ H01L 21/67051 118/58 |
| 2016/0093517 A1 | 3/2016 | Higashi et al. |

(Continued)

FOREIGN PATENT DOCUMENTS

| JP | 2009-110985 A | 5/2009 |
| JP | 2014-112652 A | 6/2014 |

(Continued)

OTHER PUBLICATIONS

Office Action for Taiwanese Application No. 108147800 dated Oct. 21, 2020.
(Continued)

*Primary Examiner* — Tinsae B Ayalew
(74) *Attorney, Agent, or Firm* — Ostrolenk Faber LLP

(57) ABSTRACT

In substrate processing, by supplying a first processing liquid onto an upper surface 91 of a substrate 9 held in a horizontal state, a liquid film 81 of the first processing liquid which entirely covers the upper surface 91 is formed. Further, by heating the substrate 9, a vapor layer 82 of the first processing liquid is formed between the upper surface 91 and the liquid film 81 of the first processing liquid on the upper surface 91. Then, by supplying a second processing liquid onto the upper surface 91 of the substrate 9, the liquid film 81 of the first processing liquid is removed from the upper surface 91. It is thereby possible to appropriately remove extraneous matters 89 from the upper surface 91 of the substrate 9, which are taken in the liquid film 81 of the first processing liquid as the vapor layer 82 is formed.

10 Claims, 12 Drawing Sheets

(58) Field of Classification Search
CPC ......... H01L 21/67288; H01L 21/68742; H01L 21/6715; H01L 21/67051; H01L 21/6708; H01L 21/67098
USPC ........................................................ 134/94.1
See application file for complete search history.

(56) References Cited

U.S. PATENT DOCUMENTS

| | | |
|---|---|---|
| 2016/0214148 A1 | 7/2016 | Okutani |
| 2017/0271177 A1* | 9/2017 | Kikumoto ................. B08B 3/08 |
| 2017/0282210 A1* | 10/2017 | Ota et al. .......... H01L 21/67051 |
| 2018/0061677 A1 | 3/2018 | Hinode et al. |
| 2018/0068876 A1 | 3/2018 | Otsuji |
| 2018/0087836 A1 | 3/2018 | Yoshihara et al. |
| 2018/0193886 A1 | 7/2018 | Abe et al. |
| 2018/0272376 A1 | 9/2018 | Abe et al. |

FOREIGN PATENT DOCUMENTS

| | | |
|---|---|---|
| JP | 2016-136599 A | 7/2016 |
| JP | 2016-162847 A | 9/2016 |
| JP | 2018-56200 A | 4/2018 |
| KR | 10-2018-0108423 A | 10/2018 |
| TW | 201631647 A | 9/2016 |
| TW | 201825195 A | 7/2018 |
| TW | 201841694 A | 12/2018 |

OTHER PUBLICATIONS

Grant of Patent for Korean Application No. 10-2019-0176320 dated Feb. 17, 2021, and translation.
Office Action dated Dec. 12, 2022 for the corresponding Japanese Application No. 2019-012311.

* cited by examiner

SUBSTRATE PROCESSING METHOD AND SUBSTRATE PROCESSING APPARATUS

This application claims priority benefit under 35 U.S.C. Section 119 of Japanese Patent Application No. 2019-012311 filed in the Japan Patent Office on Jan. 28, 2019, the entire disclosure of which is incorporated herein by reference.

TECHNICAL FIELD

The present invention relates to a technique for processing a substrate.

BACKGROUND ART

In a process of manufacturing a semiconductor device, conventionally, a substrate processing apparatus has been used, which performs processings on a semiconductor substrate (hereinafter, referred to simply as a "substrate") by using various types of processing liquids. By supplying an etching solution onto a substrate having a surface on which a resist pattern is formed, for example, etching is performed on the surface of the substrate. After the etching, a rinse liquid is supplied onto the substrate and the etching solution is thereby removed from the substrate. Then, by rotating the substrate at high speed, performed is drying of the substrate.

Further, Japanese Patent Application Laid-Open No. 2014-112652 (Document 1) discloses a drying process for drying a substrate while suppressing collapse of patterns on the substrate. In the drying process, by replacing a rinse liquid on the substrate with an organic solvent and then heating the substrate, a vapor layer of the organic solvent is formed between an upper surface of the substrate and a liquid film of the organic solvent. Then, a hole is formed in the liquid film by injecting nitrogen gas and further widened, and the liquid film of the organic solvent is thereby removed. Japanese Patent Application Laid-Open No. 2016-136599 (Document 2) discloses a technique in which the flow rate of nitrogen gas is increased in order to widen the hole in the liquid film in the above-described drying process, and the liquid film is thereby excellently removed. Japanese Patent Application Laid-Open No. 2016-162847 (Document 3) discloses a technique in which nitrogen gas is injected toward the upper surface of the substrate and gas is also injected radially in parallel with the upper surface of the substrate in order to widen the hole in the liquid film in the above-described drying process, and deposition of mists or the like on the upper surface is thereby suppressed.

The inventor of the present application ascertains that in the above-described drying process, when the vapor layer of the processing liquid is formed between the upper surface and the liquid film of the processing liquid by heating the substrate, extraneous matters deposited on the upper surface of the substrate are taken in the liquid film of the processing liquid and floated together with the liquid film. Like in Documents 1 to 3, however, in the case where the liquid film is removed by widening the hole in the liquid film, part of extraneous matters taken in the liquid film remains on the upper surface.

SUMMARY OF INVENTION

The present invention is intended for a substrate processing method for processing a substrate, and it is an object of the present invention to appropriately remove extraneous matters from an upper surface of a substrate, which are taken in a liquid film of a processing liquid as a vapor layer is formed.

The substrate processing method according to the present invention includes a) forming a liquid film of a first processing liquid which entirely covers an upper surface of a substrate held in a horizontal state by supplying the first processing liquid onto the upper surface of the substrate, b) forming a vapor layer of the first processing liquid between the liquid film of the first processing liquid on the upper surface of the substrate and the upper surface by heating the substrate, and c) removing the liquid film of the first processing liquid from the upper surface of the substrate by supplying a second processing liquid onto the upper surface.

According to the present invention, it is possible to appropriately remove extraneous matters from the upper surface of the substrate, which are taken in the liquid film of the first processing liquid as the vapor layer is formed.

In one preferred embodiment of the present invention, in the operation b), the vapor layer is formed between the upper surface and the liquid film by heating the substrate to thereby vaporize a portion of the liquid film, which is in contact with the upper surface of the substrate.

In another preferred embodiment of the present invention, heating of the substrate is in an OFF state in the operation c).

In still another preferred embodiment of the present invention, the liquid film of the first processing liquid is removed by rotating the substrate in the operation c).

In yet another preferred embodiment of the present invention, the first processing liquid used in the operation a) and the second processing liquid used in the operation c) are the same type.

In a further preferred embodiment of the present invention, the substrate processing method further includes d) forming a liquid film of the second processing liquid which entirely covers the upper surface of the substrate after the operation c), e) forming a vapor layer between the upper surface of the substrate and the liquid film by heating the substrate to thereby vaporize a portion of the liquid film, which is in contact with the upper surface, f) forming a hole at a center portion of the liquid film on the vapor layer by injecting gas toward the center portion of the liquid film, and g) removing the liquid film from the substrate by injecting gas toward the hole to thereby widen the hole outward in a radial direction.

In one aspect, a first guard having a first sidewall which has a cylindrical shape surrounding a periphery of the substrate and a first top cover which has an annular disk-like shape extending inward in the radial direction of the first sidewall and upward from an upper end of the first sidewall or a first top cover which has an annular disk-like shape extending inward in the radial direction of the first sidewall and horizontally from an upper end of the first sidewall is disposed outside the substrate in the radial direction, and a second guard having a second sidewall which has a cylindrical shape surrounding the periphery of the substrate inside the first sidewall in the radial direction and a second top cover which has an annular disk-like shape extending inward in the radial direction of the second sidewall and upward from an upper end of the second sidewall on a lower side to the first top cover or a second top cover which has an annular disk-like shape extending inward in the radial direction of the second sidewall and horizontally from an upper end of the second sidewall is disposed outside the substrate in the radial direction, and the substrate processing method further includes h) moving the first guard downward relative to the substrate, to thereby dispose the first top cover at a position lower than the upper surface of the substrate and upward away from the second top cover, concurrently with the operation g), and i) continuously exhausting a guard exhaust space which is a space between the first top cover and the second top cover positioned downward away from the first top cover, concurrently with the operations e) to h).

In another aspect, a guard having a sidewall which has a cylindrical shape surrounding a periphery of the substrate and a top cover which has an annular disk-like shape extending inward in the radial direction of the sidewall and upward from an upper end of the sidewall or a top cover which has an annular disk-like shape extending inward in the radial direction of the sidewall and horizontally from an upper end of the sidewall is disposed outside the substrate in the radial direction, and the substrate processing method further includes h) moving the guard downward relative to the substrate, to thereby dispose the top cover at a position lower than the upper surface of the substrate, at which a vertical distance between an inner peripheral edge of the top cover and the upper surface of the substrate is shorter than 4 mm, concurrently with the operation g), and i) continuously exhausting a space inside the guard in the radial direction, concurrently with the operations e) to h).

In still another aspect, a guard having a sidewall which has a cylindrical shape surrounding a periphery of the substrate and a top cover which has an annular disk-like shape extending inward in the radial direction of the sidewall and upward from an upper end of the sidewall or a top cover which has an annular disk-like shape extending inward in the radial direction of the sidewall and horizontally from an upper end of the sidewall is disposed outside the substrate in the radial direction, and the substrate processing method further includes h) moving the guard downward relative to the substrate, to thereby dispose the top cover lower than the upper surface of the substrate, concurrently with the operation g), and i) continuously exhausting a space inside the guard in the radial direction, concurrently with the operations e) to h), and in the substrate processing method, the flow rate of exhaust from the space inside the guard in the radial direction is increased in the operation i), concurrently with the operation h).

The present invention is also intended for a substrate processing apparatus for processing a substrate. The substrate processing apparatus includes a processing liquid supply part for supplying a processing liquid onto an upper surface of a substrate held in a horizontal state, a heating part for heating the substrate, and a control part for causing the processing liquid supply part to supply a first processing liquid onto the upper surface of the substrate to thereby form a liquid film of the first processing liquid which entirely covers the upper surface of the substrate, causing the heating part to heat the substrate to thereby form a vapor layer of the first processing liquid between the liquid film of the first processing liquid on the upper surface and the upper surface, and then causing the processing liquid supply part to supply a second processing liquid onto the upper surface of the substrate to thereby remove the liquid film of the first processing liquid from the upper surface.

These and other objects, features, aspects and advantages of the present invention will become more apparent from the following detailed description of the present invention when taken in conjunction with the accompanying drawings.

DESCRIPTION OF EMBODIMENTS

Figure 1:
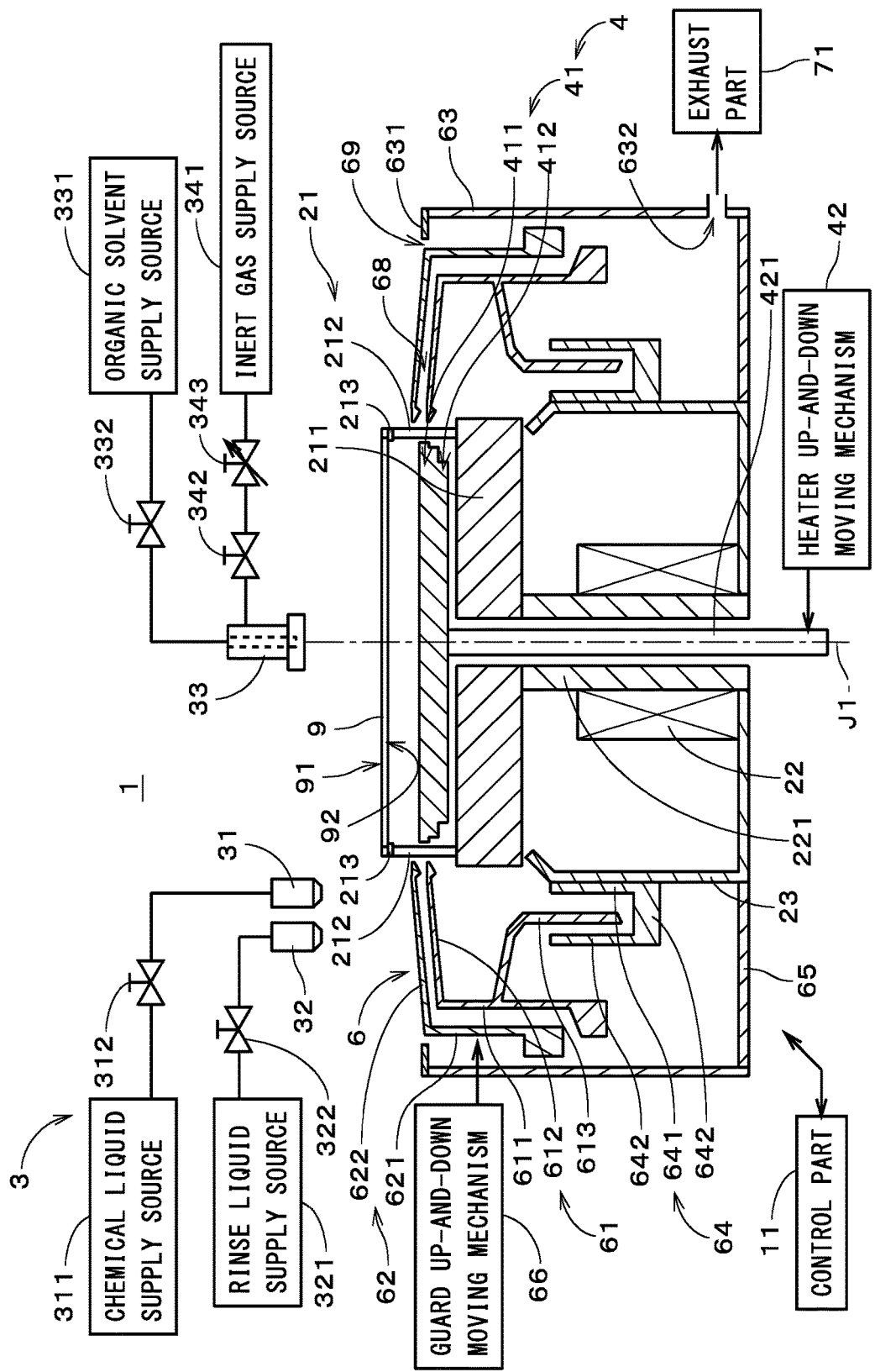
FIG. 1 is a view showing a configuration of a substrate processing apparatus.

FIG. 1 is a view showing a configuration of a substrate processing apparatus 1 in accordance with one preferred embodiment of the present invention. The substrate processing apparatus 1 is a single-substrate processing apparatus for processing disk-like substrates 9 one by one. The substrate processing apparatus 1 includes a substrate holding/rotating part 21, a gas-liquid supply part 3, a heating part 4, a cup part 6, an exhaust part 71, and a control part 11. The control part 11 is, for example, a computer including a CPU and the like, and performs a general control of the substrate processing apparatus 1.

The substrate holding/rotating part 21 includes a base part 211 having a disk-like shape around a central axis J1 directed in an up-and-down direction (vertical direction). On an upper surface of the base part 211, provided are a plurality of (for example, three or more) chuck pins 212. The plurality of chuck pins 212 are disposed at regular intervals in a circumferential direction on a circumference with the central axis J1 at the center. Each of the chuck pins 212 is rotatable about an axis in parallel with the central axis J1 by a pin drive mechanism (not shown) having a motor and a transmission mechanism. At a tip of each chuck pin 212, provided is a support part 213. The plurality of support parts 213 on the plurality of chuck pins 212 support an outer peripheral edge of the substrate 9 from downward above the base part 211. An upper surface of the base part 211 is in parallel with a main surface 92 of the substrate 9, which faces downward, (hereinafter, referred to as a "lower surface 92") and both the surfaces face each other with a clearance therebetween.

On each support part 213, provided is a gripper which protrudes upward. The pin drive mechanism rotates each chuck pin 212 toward one direction, to thereby press the grippers on the plurality of support parts 213 against an outer peripheral end surface of the substrate 9. This causes a state (hereinafter, referred to as a "substrate gripping state") in which the substrate 9 is gripped (held) in a horizontal state by the plurality of grippers. In the substrate gripping state, the center of the substrate 9 is positioned on the central axis J1. In the substrate gripping state, the pin drive mechanism rotates each chuck pin 212 in the opposite direction to the above direction, to thereby cause another state (hereinafter, referred to as a "gripping release state") in which the plurality of grippers are separated from the outer peripheral end surface of the substrate 9. In the gripping release state, the outer peripheral edge of the substrate 9 is supported from downward by the plurality of support parts 213.

The substrate holding/rotating part 21 further includes a shaft part 221, a substrate rotating mechanism 22, and a casing 23. The shaft part 221 has a rod-like shape around the central axis J1, and an upper end of the shaft part 221 is fixed on the center of a lower surface of the base part 211. The substrate rotating mechanism 22 has a motor. The substrate rotating mechanism 22 rotates a lower end of the shaft part 221, to thereby rotate the base part 211 about the central axis J1 together with the substrate 9. The casing 23 has a substantially cylindrical shape and surrounds a periphery of the shaft part 221 and the substrate rotating mechanism 22.

The heating part 4 includes a heater 41 and a heater up-and-down moving mechanism 42. The heater 41 has a disk-like shape around the central axis J1 and is disposed between the substrate 9 supported by the plurality of chuck pins 212 and the base part 211. The heater 41 is positioned on the lower surface 92 side of the substrate 9. The heater 41 is, for example, a hot plate having a resistance heating element of nichrome wire or the like. In one exemplary case, during operation of the substrate processing apparatus 1, the heater 41 is always being energized and heated at a constant temperature. The heater 41 may use a heat source other than the resistance heating element, and during operation of the substrate processing apparatus 1, the ON/OFF of the heater 41 may be switched. An exemplary heater whose ON/OFF can be switched uses an LED as a heat source. In a case where the heater uses the LED, when the current is turned on, the heater is quickly heated. Further, when the current is turned off, the heater is quickly cooled. Unlike the hot plate, the heater using the LED does not have to be always energized. Further, an up-and-down moving step described later may be omitted. An upper surface of the heater 41 extends almost entirely over the lower surface 92 of the substrate 9 and directly faces the lower surface 92. The upper surface of the heater 41 is almost in parallel with the lower surface 92 of the substrate 9. The heater 41 of FIG. 1 includes a heater upper portion 411 and a heater lower portion 412. The heater upper portion 411 has a disk-like shape facing the lower surface 92 of the substrate 9. The heater lower portion 412 has a disk-like shape having a diameter smaller than that of the heater upper portion 411 and is continuous with a lower side of the heater upper portion 411.

On the center of a lower surface of the heater 41 (a lower surface of the heater lower portion 412), an upper end of an up-and-down moving axis 421 around the central axis J1 is fixed. The base part 211 and the shaft part 221 have a hollow portion extending in the up-and-down direction on the central axis J1, and the up-and-down moving axis 421 is disposed inside the hollow portion. The up-and-down moving axis 421 extends downward up to a position lower than a lower end of the shaft part 221. Below the shaft part 221, a lower end portion of the up-and-down moving axis 421 is connected to the heater up-and-down moving mechanism 42.

The heater up-and-down moving mechanism 42 supports the heater 41 with the up-and-down moving axis 421 interposed therebetween. The heater up-and-down moving mechanism 42 includes, for example, a motor and a ball screw, and is driven by the motor to move on the up-and-down moving axis 421 in the up-and-down direction. In the present exemplary processing, the heater 41 is selectively placed at an upper position where the upper surface of the heater 41 is positioned upper than the plurality of support parts 213 and at a lower position where the lower surface of the heater 41 is in proximity to the base part 211. The upper surface of the heater 41 positioned at the lower position is positioned lower than the plurality of support parts 213. The heater up-and-down moving mechanism 42 may place the heater 41 at any position between the upper position and the lower position.

Figure 5A:
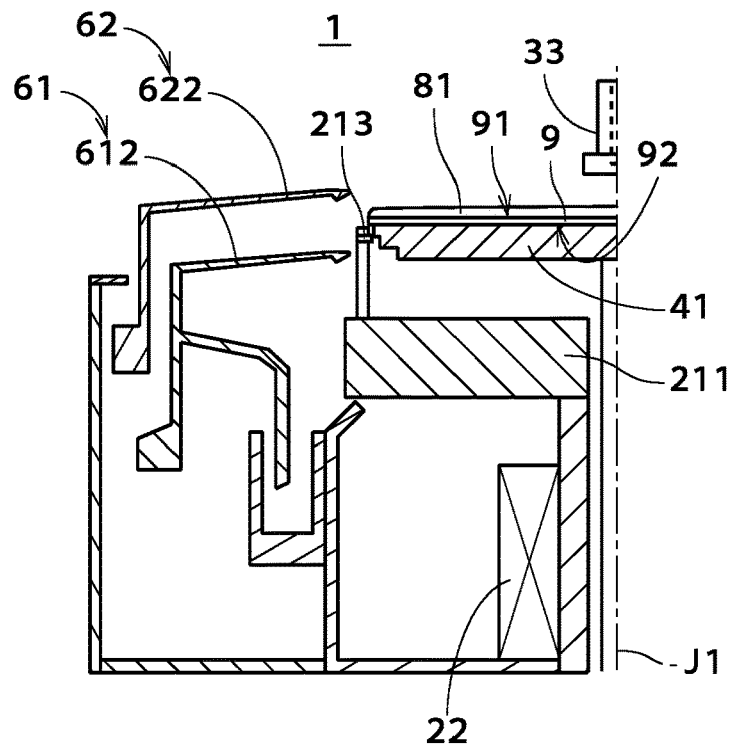
FIG. 5A is a view used for explaining an operation of the substrate processing apparatus.

In the gripping release state, by moving the heater 41 from the lower position to the upper position, the substrate 9 is passed from the plurality of support parts 213 to the upper surface of the heater 41 (see later-described FIG. 5A). The heater 41 thereby comes into contact with the lower surface 92 of the substrate 9, and the lower surface 92 is heated almost uniformly while the substrate 9 is supported by the heater 41. Further, by moving the heater 41 from the upper position to the lower position, the substrate 9 is passed from the upper surface of the heater 41 to the plurality of support parts 213. The heater 41 is thereby separated from the lower surface 92 of the substrate 9, and the substrate 9 is supported by the plurality of support parts 213. In the state where the heater 41 is placed at the lower position, the lower surface 92 of the substrate 9 is hardly heated. In the following description, it is assumed that by placing the heater 41 at the lower position, heating of the substrate 9 is brought into an OFF state.

Further, there may be a configuration in which a plurality of microprojections are provided on the upper surface of the heater 41 and the substrate 9 is supported by the plurality of microprojections in the state where the heater 41 is placed at the upper position. Also in this case, it can be understood that the substrate 9 is supported by the heater 41. Furthermore, in the state where the substrate 9 is held by the plurality of grippers (i.e., in the substrate gripping state), the heater 41 positioned at the upper position may come into contact with or proximity to the lower surface 92 of the substrate 9. By bring the heater 41 positioned at the upper position into contact with or proximity to the lower surface 92 of the substrate 9, the substrate 9 is heated by the heater 41.

The cup part 6 includes an inner guard 61, an outer guard 62, an outermost peripheral wall 63, a liquid collecting part 64, a cup bottom 65, and a guard up-and-down moving mechanism 66. The inner guard 61, the outer guard 62, and the outermost peripheral wall 63 are provided in this order outward from the central axis J1 in a radial direction. As described later, the inner guard 61 and the outer guard 62 are movable in the up-and-down direction and the outer guard 62 is a movable outermost guard.

The inner guard 61 includes an inner sidewall 611, an inner top cover 612, and a liquid guiding part 613. The inner sidewall 611 has a cylindrical shape around the central axis J1 and surrounds a periphery of the base part 211. The inner top cover 612 has an annular disk-like shape extending inward in the radial direction and upward from an upper end of the inner sidewall 611. An inner peripheral edge of the inner top cover 612 has a circular shape around the central axis J1 and is in proximity to the plurality of chuck pins 212. An upper portion of the liquid guiding part 613 has an annular disk-like shape extending inward in the radial direction and downward from an inner peripheral surface of the inner sidewall 611. A lower portion of the liquid guiding part 613 has a cylindrical shape around the central axis J1 and is continuous with the upper portion thereof.

The outer guard 62 includes an outer sidewall 621 and an outer top cover 622. The outer sidewall 621 has a cylindrical shape around the central axis J1 and surrounds a periphery of the inner sidewall 611. When viewed along the up-and-down direction, the outer sidewall 621 surrounds a periphery of the substrate 9 outside the inner sidewall 611 in the radial direction. In other words, the inner sidewall 611 surrounds the periphery of the substrate 9 inside the outer sidewall 621 in the radial direction. The outer top cover 622 has an annular disk-like shape extending inward in the radial direction and upward from an upper end of the outer sidewall 621. An inner peripheral edge of the outer top cover 622 has a circular shape around the central axis J1 and is in proximity to the plurality of chuck pins 212. The outer top cover 622 is positioned upper than the inner top cover 612. When viewed along the up-and-down direction, the inner peripheral edge of the outer top cover 622 almost coincides with the inner peripheral edge of the inner top cover 612 positioned lower than the outer top cover 622. In other words, the diameter of the inner peripheral edge of the outer top cover 622 is almost equal to that of the inner peripheral edge of the inner top cover 612. The cup part 6 of FIG. 1, the inner peripheral edge of the outer top cover 622 is an upper end of the outer guard 62, and the inner peripheral edge of the inner top cover 612 is an upper end of the inner guard 61.

The cup bottom 65 is an annular plate spreading outward in the radial direction from the casing 23. The cup bottom 65 is provided with a discharge pipe (not shown), and a liquid on the cup bottom 65 is discharged outside through the discharge pipe. The outermost peripheral wall 63 has a cylindrical shape around the central axis J1 and extends upward from an outer peripheral edge of the cup bottom 65. The outermost peripheral wall 63 surrounds a periphery of the outer sidewall 621. At an upper end of the outermost peripheral wall 63, provided is an exhaust ring 631. The exhaust ring 631 is an annular plate spreading inward in the radial direction from the outermost peripheral wall 63. The diameter of an inner peripheral edge of the exhaust ring 631 is slightly larger than that of the outer sidewall 621. The inner peripheral edge of the exhaust ring 631 faces the outer sidewall 621 with a clearance therebetween. Between the inner peripheral edge of the exhaust ring 631 and the outer sidewall 621, formed is a gap 69 (hereinafter, referred to as an "outermost exhaust gap 69") having an annular shape around the central axis J1. The outermost peripheral wall 63 is provided with an exhaust outlet 632 in the vicinity of the cup bottom 65. As described later, to the exhaust outlet 632, connected is an exhaust part 71.

The liquid collecting part 64 includes an inner cylindrical portion 641, an annular bottom 642, and an outer cylindrical portion 643. The inner cylindrical portion 641 and the outer cylindrical portion 643 each has a cylindrical shape around the central axis J1. The inner cylindrical portion 641 is fixed onto an outer peripheral surface of the casing 23. The annular bottom 642 is an annular plate spreading outward in the radial direction from a lower end of the inner cylindrical portion 641. The outer cylindrical portion 643 extends upward from an outer peripheral edge of the annular bottom 642. The annular bottom 642 is provided with a discharge pipe (not shown), and a liquid on the annular bottom 642 is discharged outside through the discharge pipe. The lower portion of the liquid guiding part 613 in the inner guard 61 is disposed between the inner cylindrical portion 641 and the outer cylindrical portion 643.

The guard up-and-down moving mechanism 66 includes, for example, a motor and a ball screw, and moves each of the inner guard 61 and the outer guard 62 in the up-and-down direction. For example, the inner guard 61 can be placed at any position between a predetermined upper position and a predetermined lower position, and the outer guard 62 can be also placed at any position between a predetermined upper position and a predetermined lower position. When the substrate 9 is loaded or unloaded into/from the substrate processing apparatus 1, as shown in FIG. 1, the inner guard 61 is placed at the lower position and the outer guard 62 is also placed at the lower position. The upper end of the inner guard 61 and the upper end of the outer guard 62 are thereby placed lower than the plurality of support parts 213 and the substrate 9, and this prevents interference with an external transfer mechanism.

In a state where the upper end of the outer guard 62 is placed upper than the substrate 9 and the upper end of the inner guard 61 is placed lower than the substrate 9 (see later-described FIG. 3B), the outer guard 62 directly faces the substrate 9 in the radial direction. In this state, a liquid spattering from the substrate 9 is received by an inner peripheral surface of the outer guard 62 and guided to the cup bottom 65 through the inner peripheral surface thereof and an outer peripheral surface of the inner guard 61. In a state where the upper end of the outer guard 62 is placed upper than the substrate 9 and the upper end of the inner guard 61 is also placed upper than the substrate 9 (see later-described FIG. 3A), the inner guard 61 directly faces the substrate 9 in the radial direction. In this state, a liquid spattering from the substrate 9 is received by an inner peripheral surface of the inner guard 61 and guided to the liquid collecting part 64 through the liquid guiding part 613.

The exhaust part 71 of FIG. 1 has, for example, a pump and an exhaust pipe and is connected to the exhaust outlet 632 of the outermost peripheral wall 63. The exhaust part 71 exhausts gas inside the outermost peripheral wall 63 to the outside thereof. A space inside the inner guard 61 communicates with the exhaust outlet 632 through a clearance between the lower portion of the liquid guiding part 613 and each of the inner cylindrical portion 641 and the outer cylindrical portion 643 of the liquid collecting part 64. A space 68 (hereinafter, referred to as a "guard exhaust space 68") between the inner top cover 612 of the inner guard 61 and the outer top cover 622 of the outer guard 62 communicates with the exhaust outlet 632 through a clearance between the inner sidewall 611 and the outer sidewall 621. The outermost exhaust gap 69 between the inner peripheral edge of the exhaust ring 631 and the outer guard 62 communicates with the exhaust outlet 632 through a clearance between the outer sidewall 621 and the outermost peripheral wall 63. In the exhaust part 71, an atmosphere around the substrate 9 can be exhausted through the inside of the inner guard 61, the guard exhaust space 68, and the outermost exhaust gap 69. Further, in the exhaust part 71, it is possible to change the exhaust flow rate by adjustment of a damper provided in the exhaust pipe, adjustment of an output of the pump, or the like.

The gas-liquid supply part 3 includes a first nozzle 31, a second nozzle 32, and a third nozzle 33. As described later, the gas-liquid supply part 3 is a processing liquid supply part for supplying a processing liquid onto a main surface 91 of the substrate 9, which faces upward, (hereinafter, referred to as an "upper surface 91") through the first to third nozzles 31 to 33. Further, the gas-liquid supply part 3 is a gas injection part for injecting gas toward the upper surface 91 of the substrate 9 through the third nozzle 33.

The first nozzle 31 is connected to a chemical liquid supply source 311 through an on-off valve 312. The first nozzle 31 is selectively placed at a facing position facing a center portion of the upper surface 91 of the substrate 9 and at a waiting position away from the substrate 9 outward in the radial direction by a nozzle moving mechanism (not shown) having a motor and an arm. The chemical liquid supply source 311 supplies a chemical liquid to the first nozzle 31, and the chemical liquid is thereby ejected downward from the first nozzle 31. The chemical liquid is, for example, hydrofluoric acid, SC1 (ammonia hydrogen peroxide mixture), SC2 (hydrochloric acid hydrogen peroxide mixture), buffered hydrofluoric acid (mixture of hydrofluoric acid and ammonium fluoride), or the like.

The second nozzle 32 is connected to a rinse liquid supply source 321 through an on-off valve 322. The second nozzle 32 is supported by, for example, the same arm as the first nozzle 31 is supported by, and selectively placed at the facing position facing the center portion of the upper surface 91 of the substrate 9 and at the waiting position away from the substrate 9 outward in the radial direction by the above-described nozzle moving mechanism. The rinse liquid supply source 321 supplies a rinse liquid to the second nozzle 32, and the rinse liquid is thereby ejected downward from the second nozzle 32. The rinse liquid is, for example, pure water (DIW: Deionized Water). A rinse liquid other than pure water may be used. Further, the first nozzle 31 and the second nozzle 32 may be moved by individual nozzle moving mechanisms.

The third nozzle 33 is connected to an organic solvent supply source 331 through an on-off valve 332. The third nozzle 33 is selectively placed at the facing position facing the center portion of the upper surface 91 of the substrate 9 and at a waiting position away from the substrate 9 outward in the radial direction by another nozzle moving mechanism (not shown) having a motor and an arm. The organic solvent supply source 331 supplies an organic solvent to the third nozzle 33, and the organic solvent is thereby ejected downward from the third nozzle 33. A preferable organic solvent has a surface tension lower than that of the rinse liquid, and is, for example, IPA (isopropyl alcohol). An organic solvent (for example, methanol, ethanol, acetone, hydrofluoroether (HFE), or the like) other than IPA may be used.

The third nozzle 33 is further connected to an inert gas supply source 341 through an on-off valve 342 and a flow rate regulating valve 343. The third nozzle 33 is provided with a gas injection outlet, for example, around an outlet of the processing liquid (organic solvent). The inert gas supply source 341 supplies an inert gas to the third nozzle 33, and the inert gas is thereby injected downward from the third nozzle 33. In the third nozzle 33, it is possible to adjust the injection flow rate of the inert gas with high accuracy by the flow rate regulating valve 343. The inert gas is, for example, nitrogen gas. An inert gas other than nitrogen gas may be used. Further, depending on the types of films, patterns or the like formed on the substrate 9, any type of gas other than the inert gas (for example, dry air) may be used. The third nozzle 33 may be additionally provided with a gas injection outlet which injects gas outward in the radial direction.

Figure 2A:
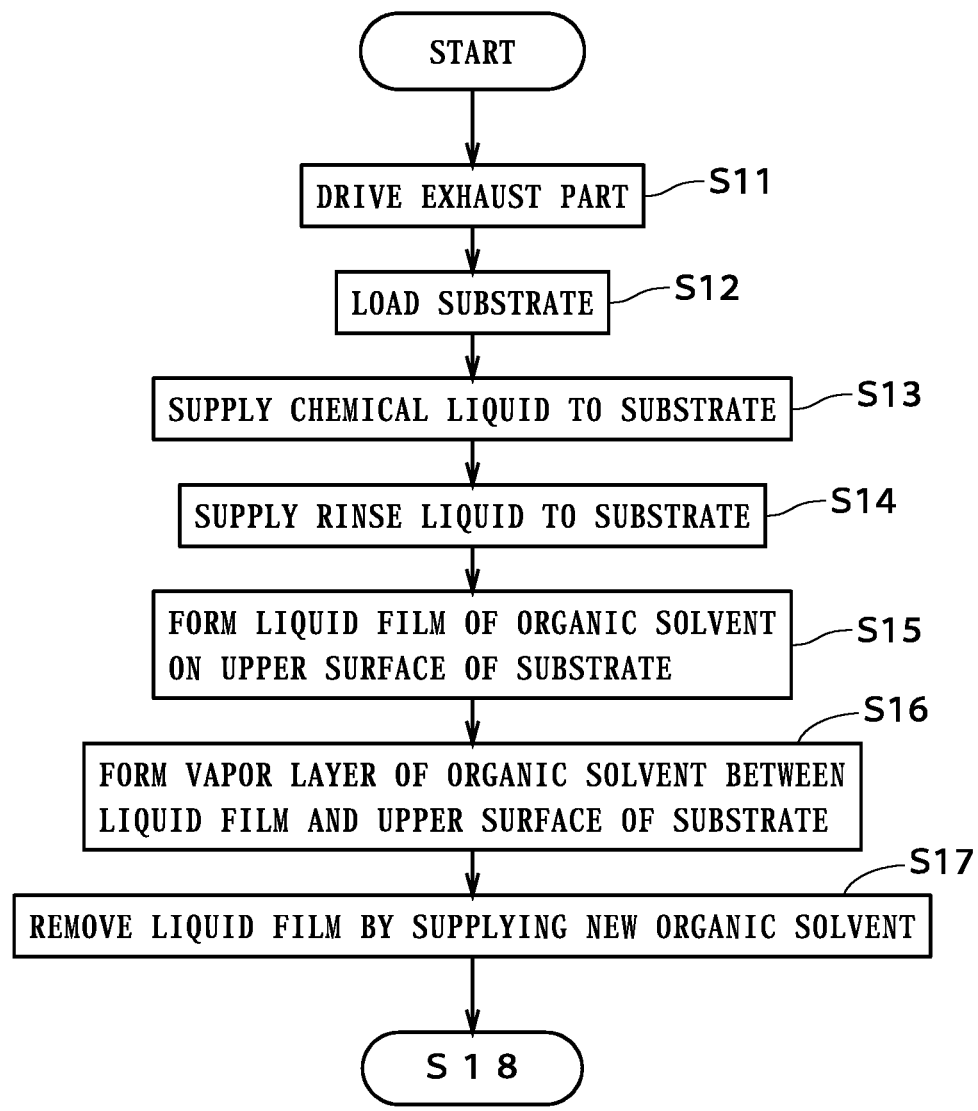
FIG. 2A is a flowchart showing an operation flow for processing a substrate.
Figure 2B:
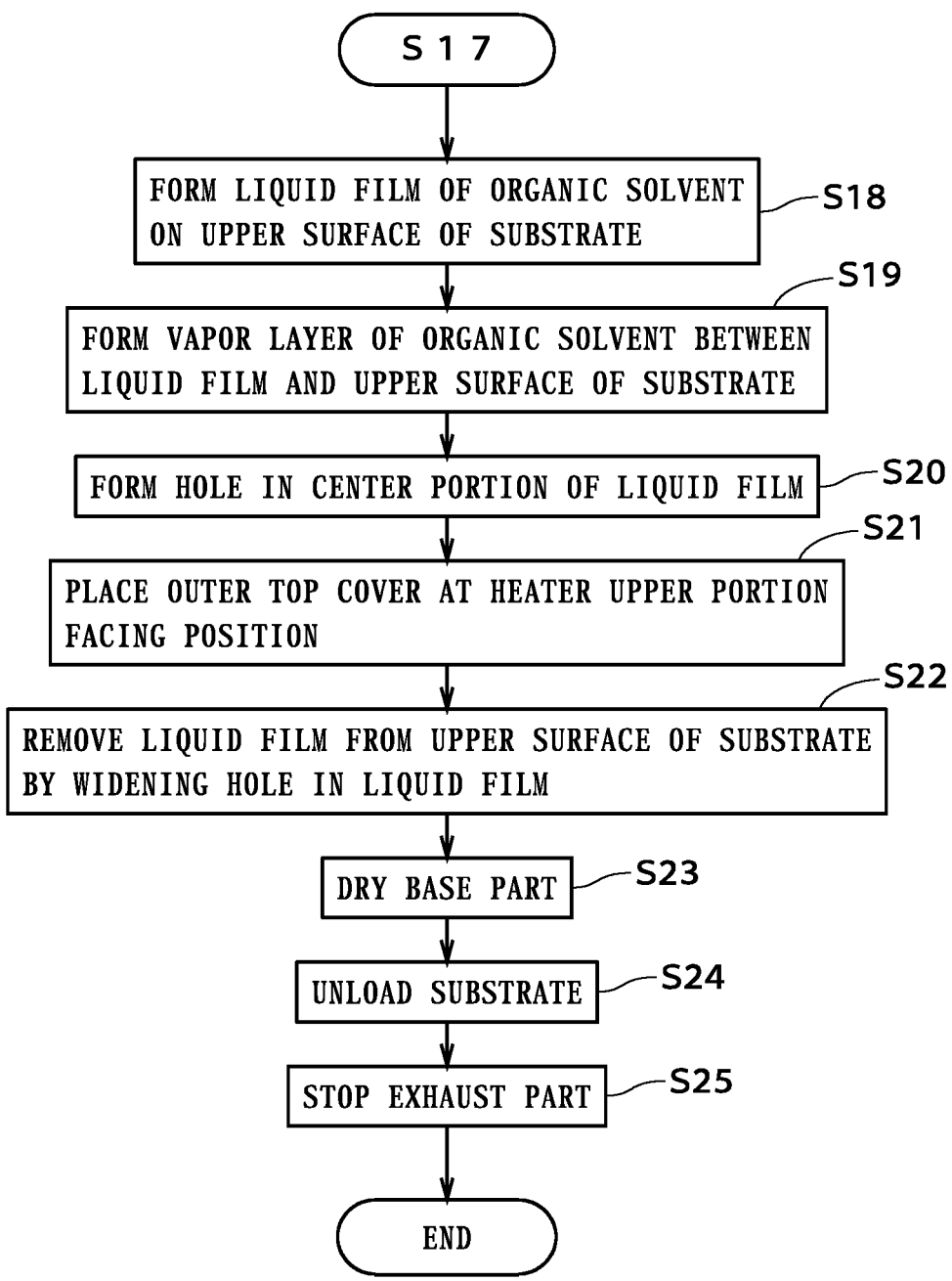
FIG. 2B is a flowchart showing the operation flow for processing the substrate.

FIGS. 2A and 2B are flowcharts showing an operation flow of the substrate processing apparatus 1 for processing the substrate 9. An operation of the substrate processing apparatus 1 described below is performed under control of the control part 11 as a general rule. In the substrate processing apparatus 1 of FIG. 1, the exhaust part 71 is driven and the inside of the outermost peripheral wall 63 is exhausted at a predetermined normal exhaust flow rate (Step S11). Further, during operation of the substrate processing apparatus 1, the exhaust part 71 may be always driven.

In a state where the inner guard 61 is placed at the lower position and the outer guard 62 is also placed at the lower position, the substrate 9 is loaded by an external transfer mechanism and placed on the plurality of support parts 213 (Step S12). Each of the chuck pins 212 is rotated and the grippers on the support parts 213 are thereby pressed against the outer peripheral end surface of the substrate 9. This forms the substrate gripping state in which the substrate 9 is held by the plurality of grippers. After that, the substrate rotating mechanism 22 starts rotation of the substrate 9 at a predetermined rotation speed. At that time, the heater 41 is placed at the lower position and heating of the substrate 9 is in the OFF state.

Figure 3A:
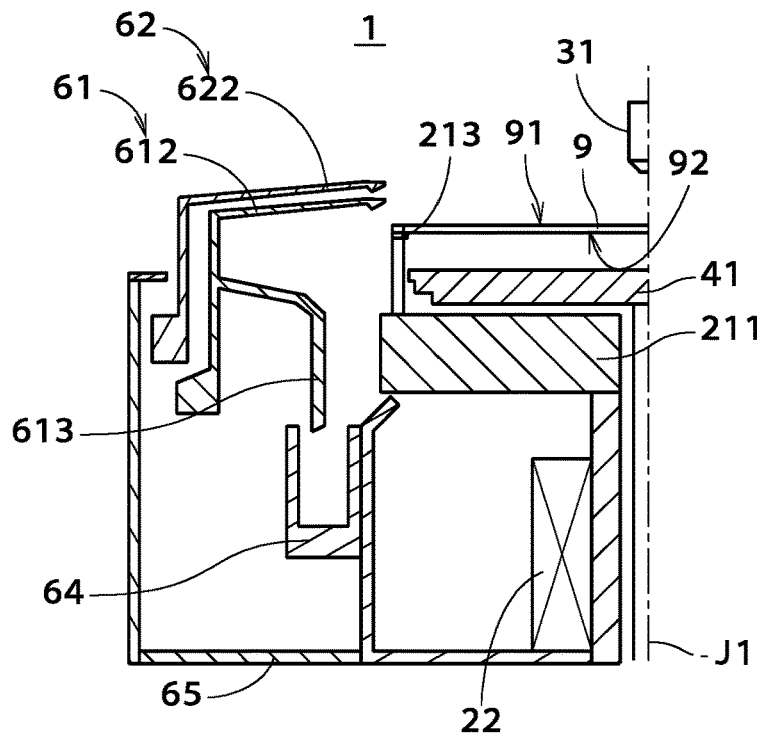
FIG. 3A is a view used for explaining an operation of the substrate processing apparatus.

In the cup part 6, the inner guard 61 and the outer guard 62 are moved upward by the guard up-and-down moving mechanism 66, and as shown in FIG. 3A, the inner guard 61 directly faces the substrate 9 in the radial direction. Further, by the nozzle moving mechanism, the first nozzle 31 and the second nozzle 32 are placed at the facing position facing the center portion of the upper surface 91 of the substrate 9. By opening the on-off valve 312, the chemical liquid supply source 311 supplies the chemical liquid to the first nozzle 31, and the chemical liquid is thereby supplied onto the center portion of the upper surface 91 from the first nozzle 31 (Step S13). On the upper surface 91, the chemical liquid is spread toward the outer peripheral edge of the substrate 9 by the centrifugal force due to the rotation of the substrate 9 and supplied entirely onto the upper surface 91. The chemical liquid spattering from the outer peripheral edge of the substrate 9 is received by the inner peripheral surface of the inner guard 61 and collected by the liquid collecting part 64 (the same applies to the supply of the rinse liquid described later). Further, the ejection of the chemical liquid from the first nozzle 31 may be performed continuously or intermittently. The same applies to the ejection of the rinse liquid from the second nozzle 32, the ejection of the organic solvent from the third nozzle 33, and the injection of the inert gas from the third nozzle 33, which are described later.

After the supply of the chemical liquid has continued for a predetermined time, the supply of the chemical liquid is stopped. Subsequently, by opening the on-off valve 322, the rinse liquid supply source 321 supplies the rinse liquid to the second nozzle 32, and the rinse liquid is thereby supplied in the vicinity of the center portion of the upper surface 91 from the second nozzle 32 (Step S14). On the upper surface 91, the rinse liquid is spread toward the outer peripheral edge of the substrate 9 by the rotation of the substrate 9 and supplied entirely onto the upper surface 91. By supplying the rinse liquid, the chemical liquid deposited on the upper surface 91 is removed. The supply of the rinse liquid continues for a predetermined time and then the supply is stopped.

Figure 3B:
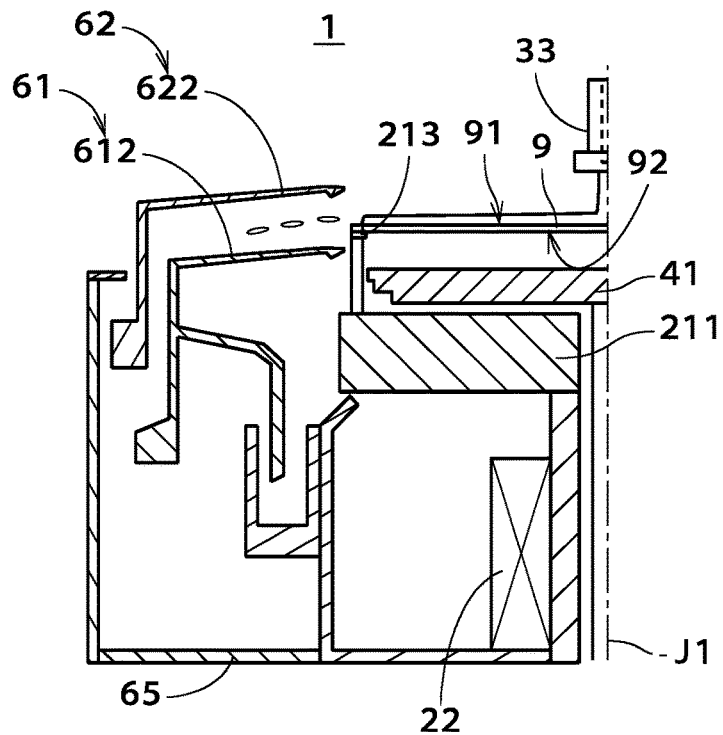
FIG. 3B is a view used for explaining the operation of the substrate processing apparatus.

Subsequently, the inner guard 61 is moved downward, and as shown in FIG. 3B, the outer guard 62 directly faces the substrate 9 in the radial direction. Further, the first nozzle 31 and the second nozzle 32 are moved to the waiting position away from the substrate 9 outward in the radial direction, and the third nozzle 33 is placed at the facing position facing the center portion of the upper surface 91 of the substrate 9. By opening the on-off valve 332, the organic solvent supply source 331 supplies the organic solvent to the third nozzle 33, and the organic solvent is thereby supplied onto the center portion of the upper surface 91 from the third nozzle 33. At that time, the substrate 9 is rotated at a first rotation speed. On the upper surface 91, the organic solvent is spread toward the outer peripheral edge of the substrate 9 by the centrifugal force and supplied entirely onto the upper surface 91. In other word, the rinse liquid deposited on the upper surface 91 is replaced with the organic solvent. The organic solvent spattering from the outer peripheral edge of the substrate 9 is received by the inner peripheral surface of the outer guard 62 and collected by the cup bottom 65. Further, in order to prevent the upper surface 91 from being dried in a period after stopping the supply of the rinse liquid from the second nozzle 32 until starting the supply of the organic solvent from the third nozzle 33, pure water may be supplied onto the upper surface 91 from a not-shown pure water nozzle.

Figure 3C:
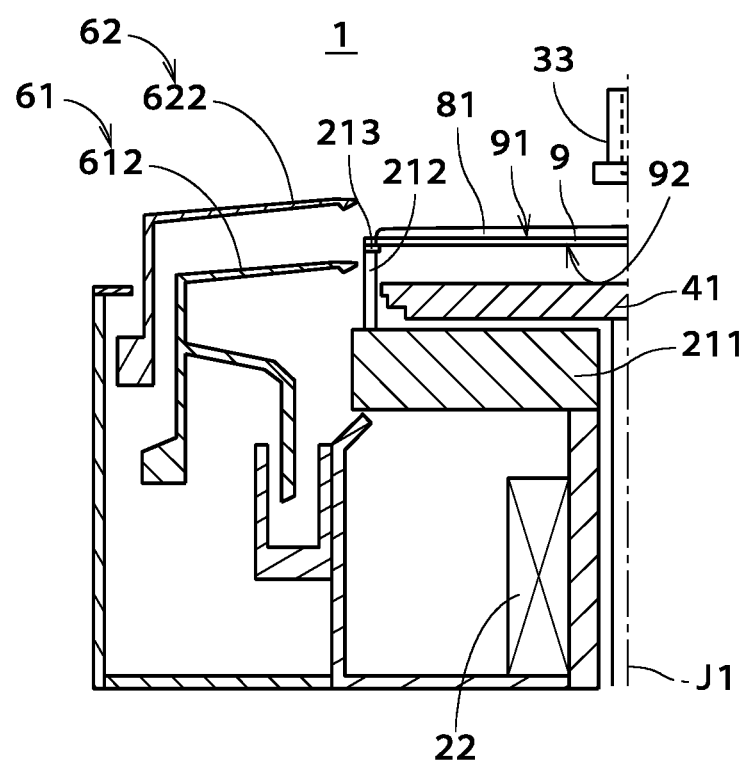
FIG. 3C is a view used for explaining the operation of the substrate processing apparatus.

After a predetermined time has elapsed from starting the supply of the organic solvent, the rotation speed of the substrate 9 is reduced step by step by the substrate rotating mechanism 22. In the present exemplary processing, the rotation speed of the substrate 9 is reduced to a second rotation speed lower than the first rotation speed, and after the rotation of the substrate 9 at the second rotation speed has continued for a predetermined time, the rotation of the substrate 9 is stopped. After stopping the rotation of the substrate 9, the ejection of the organic solvent (first processing liquid) from the third nozzle 33 is stopped. A liquid film 81 of the organic solvent (puddle of the organic solvent) is thereby formed on the upper surface 91 of the substrate 9 held in the horizontal state, as shown in FIG. 3C (Step S15). The liquid film 81 of the organic solvent entirely covers the upper surface 91 of the substrate 9, and in other words, the liquid film 81 which is spread entirely over the upper surface 91 is formed. Herein, the liquid film 81 of the organic solvent is a lump of organic solvent remaining on the upper surface 91 in the state where the rotation of the substrate 9 is stopped.

Figure 4:
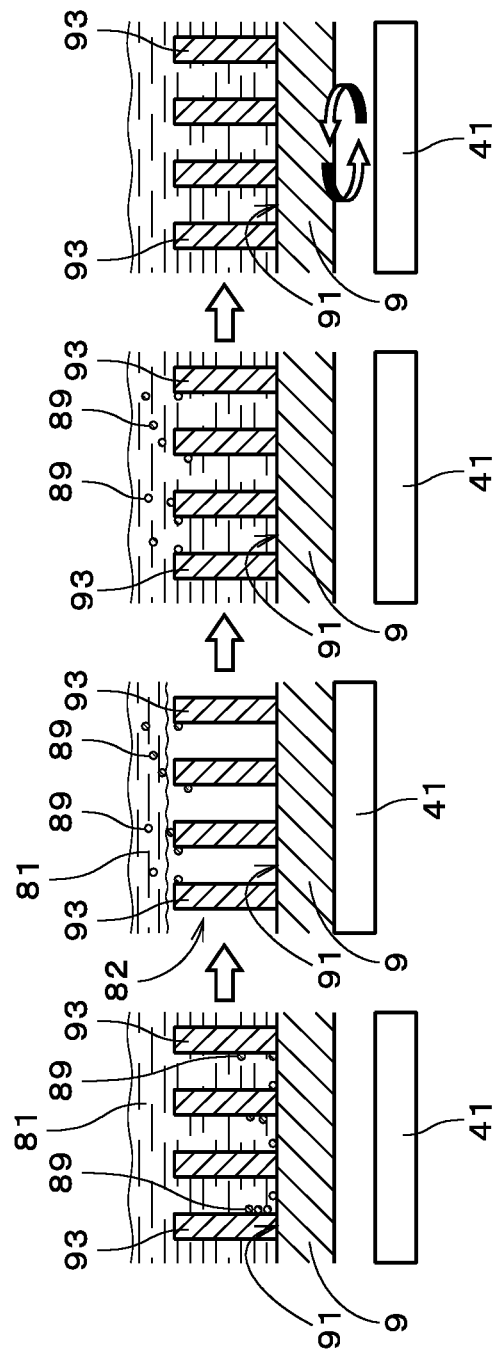
FIG. 4 is a view schematically showing an upper surface of a substrate being processed.

FIG. 4 is a view schematically showing the upper surface 91 of the substrate 9. As shown on the leftmost side of FIG. 4, on the upper surface 91 of the substrate 9, a predetermined pattern is formed, and the pattern includes, for example, a large number of pattern elements 93 which stand erect. The thickness of the liquid film 81 of the organic solvent is sufficiently larger than the height of the pattern element 93 and the whole of the pattern elements 93 is included (covered with) in the liquid film 81 of the organic solvent.

Subsequently, each of the chuck pins 212 is rotated, and the gripping release state in which the plurality of grippers are separated from the outer peripheral end surface of the substrate 9 is thereby formed. In the gripping release state, the substrate 9 is supported from downward by the plurality of support parts 213. Then, the heater 41 is moved from the lower position to the upper position by the heater up-and-down moving mechanism 42, and as shown in FIG. 5A, the substrate 9 is passed from the plurality of support parts 213 to the upper surface of the heater 41. The heater 41 thereby comes into contact with the lower surface 92 of the substrate 9, and the lower surface 92 is heated almost uniformly and quickly while the substrate 9 is supported by the heater 41 in the horizontal state.

The substrate 9 is heated up to a temperature not lower than the boiling point of the organic solvent (for example, 180 to 220° C.) by the heater 41. When the liquid film 81 of the organic solvent receives heat from the upper surface 91 of the substrate 9, part of the liquid film 81 (i.e., a portion in contact with the upper surface 91) is vaporized in an interface with the upper surface 91. Thus, by heating the substrate 9 from the lower surface 92 side, as shown in the second from the left of FIG. 4, a vapor layer 82 of the organic solvent is formed between the upper surface 91 and the liquid film 81 of the organic solvent (Step S16). With the existence of the vapor layer 82, the liquid film 81 is floated from the upper surface 91 entirely over the upper surface 91. At that time, extraneous matters 89 (unnecessary substances such as polymer or the like) deposited on the pattern elements 93 and the upper surface 91 of the substrate 9 are taken in the liquid film 81 of the organic solvent and floated from the upper surface 91 together with the liquid film 81. For example, the thickness of the vapor layer 82 is larger than the height of the pattern element 93 and almost the whole of the pattern elements 93 is included in the vapor layer 82.

Figure 5B:
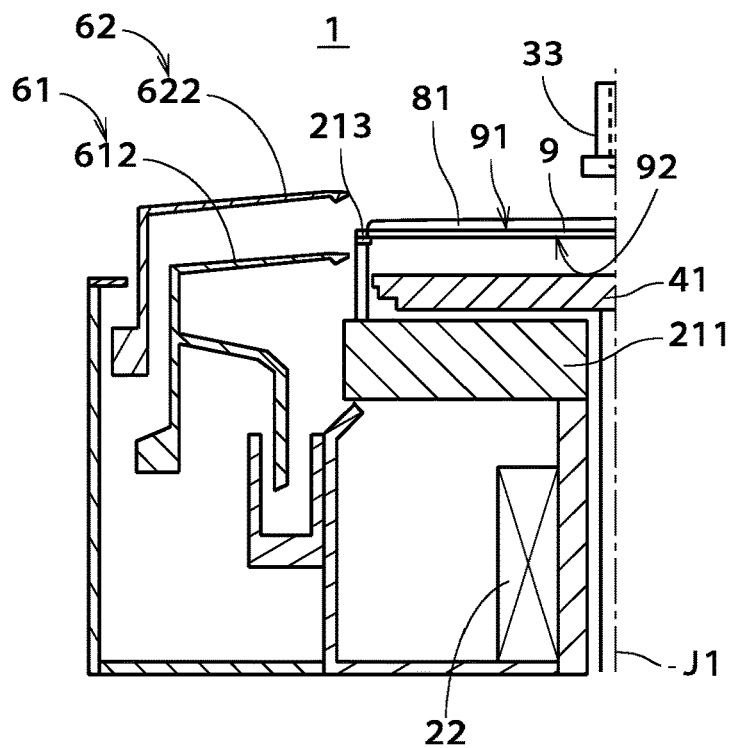
FIG. 5B is a view used for explaining the operation of the substrate processing apparatus.

In the substrate processing apparatus 1, the heating time in which heating of the substrate 9 should continue after the heater 41 is placed at the upper position is obtained in advance by experiments or the like. After the heating time has elapsed, the heater 41 is moved from the upper position to the lower position, and as shown in FIG. 5B, the substrate 9 is passed from the upper surface of the heater 41 to the plurality of support parts 213. The heating of the substrate 9 by the heater 41 is thereby brought into the OFF state. By limiting the heating of the substrate 9 by the heater 41 to the above-described heating time, it is possible to prevent or suppress excessive progression of vaporization of the liquid film 81 of the organic solvent and occurrence of a hole in the liquid film 81. Further in the OFF state, the substrate 9 may be heated to a temperature lower than the boiling point of the organic solvent by the radiant heat of the heater 41. After that, the grippers in the plurality of support parts 213 are pressed against the outer peripheral end surface of the substrate 9, and the substrate gripping state is thereby formed.

Figure 5C:
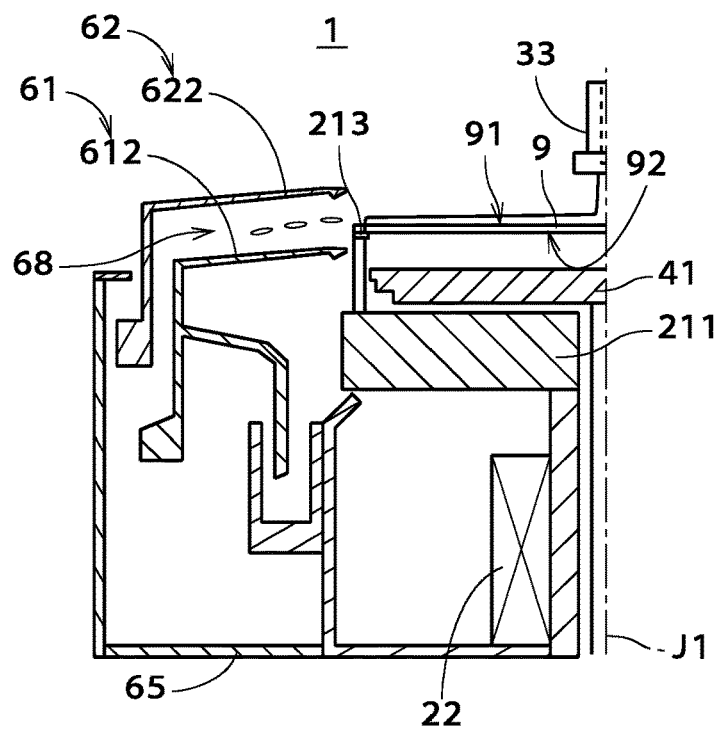
FIG. 5C is a view used for explaining the operation of the substrate processing apparatus.

Subsequently, as shown in FIG. 5C, a new organic solvent is supplied onto the center portion of the upper surface 91 of the substrate 9 from the third nozzle 33. As shown in the third from the left of FIG. 4, the vapor layer 82 of the organic solvent is extinguished and the whole of the pattern elements 93 is included in the organic solvent. Further, after starting the supply of the organic solvent, the rotation of the substrate 9 is started (restarted) by the substrate rotating mechanism 22 and the substrate 9 is rotated at a third rotation speed. The organic solvent containing the extraneous matters 89 (in other words, the liquid film 81 of the organic solvent in which the extraneous matters are dissolved or floated) spatters from the outer peripheral edge of the substrate 9 by the centrifugal force, and as shown on the rightmost side of FIG. 4, the extraneous matters 89 are removed from the upper surface 91 (Step S17). The organic solvent spattering from the substrate 9 is received by the inner peripheral surface of the outer guard 62 and collected by the cup bottom 65. Thus, by supplying the new organic solvent (second processing liquid), the liquid film 81 containing the extraneous matters 89 is removed and the upper surface 91 is entirely covered with the new organic solvent (in other words, the liquid film 81 containing the extraneous matters 89 and the vapor layer 82 are replaced with the new organic solvent).

Though the organic solvent of room temperature is ejected from the third nozzle 33 in the present exemplary processing, a heated organic solvent may be ejected. In this case, the extraneous matters 89 becomes easier to be taken in the new organic solvent, and it is thereby possible to efficiently remove the extraneous matters 89 from the upper surface 91. Further, in Step S17, the third nozzle 33 may eject the new organic solvent while being moved along the upper surface 91 of the substrate 9.

Figure 5D:
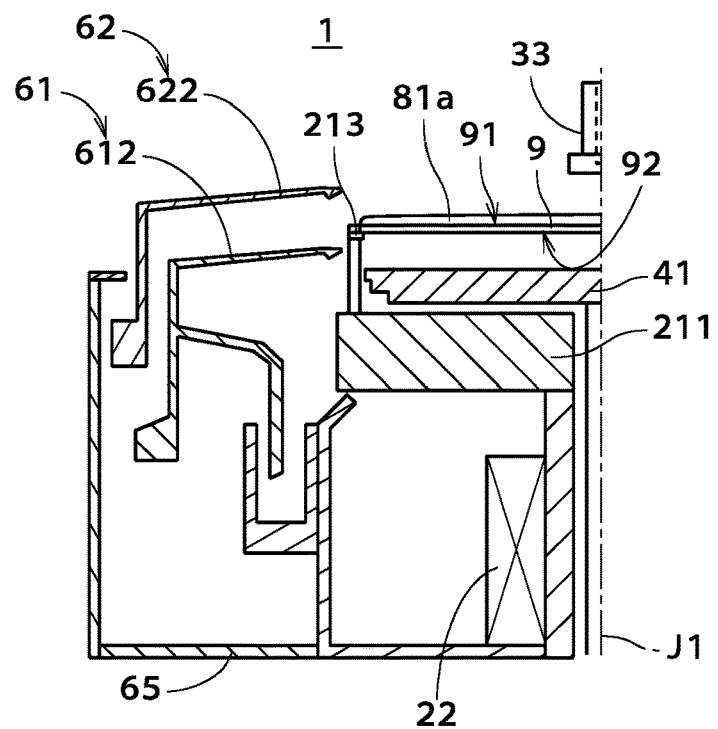
FIG. 5D is a view used for explaining the operation of the substrate processing apparatus.

After a predetermined time has elapsed from starting the supply of the organic solvent, the rotation speed of the substrate 9 is reduced step by step by the substrate rotating mechanism 22. In the present exemplary processing, the rotation speed of the substrate 9 is reduced to a fourth rotation speed lower than the third rotation speed, and after the rotation of the substrate 9 at the fourth rotation speed has continued for a predetermined time, the rotation of the substrate 9 is stopped. After stopping the rotation of the substrate 9, the ejection of the organic solvent from the third nozzle 33 is stopped. A liquid film 81a of the organic solvent (puddle of the organic solvent) which entirely covers the upper surface 91 of the substrate 9 is thereby formed again, as shown in FIG. 5D (Step S18). As shown on the leftmost side of FIG. 6, the thickness of the liquid film 81a of the organic solvent is sufficiently larger than the height of the pattern element 93 and the whole of the pattern elements 93 is included in the liquid film 81a of the organic solvent.

Figure 6:
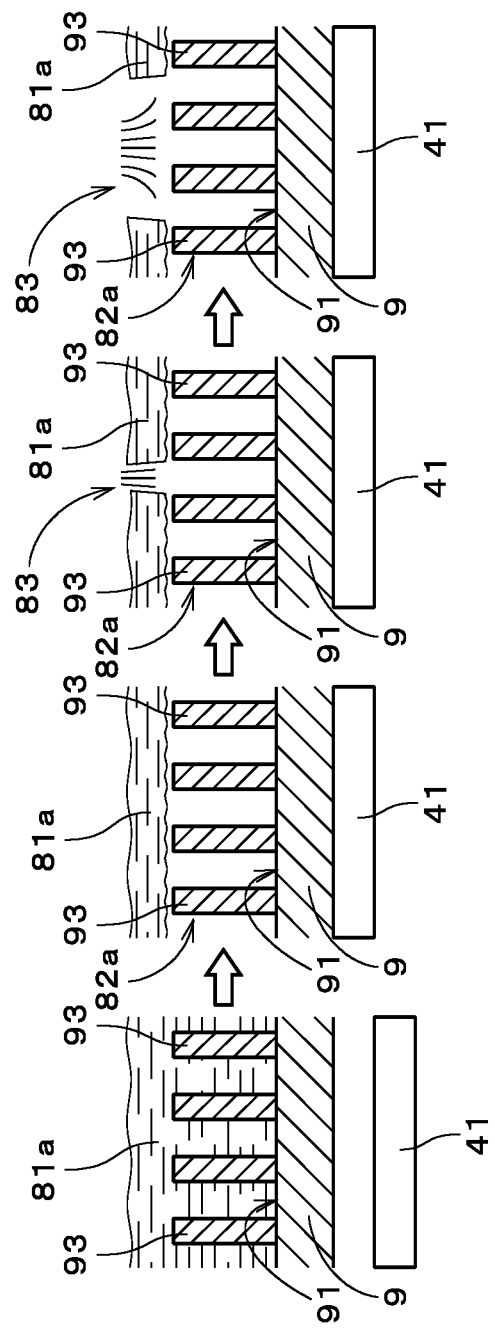
FIG. 6 is a view schematically showing the upper surface of the substrate being processed.
Figure 7A:
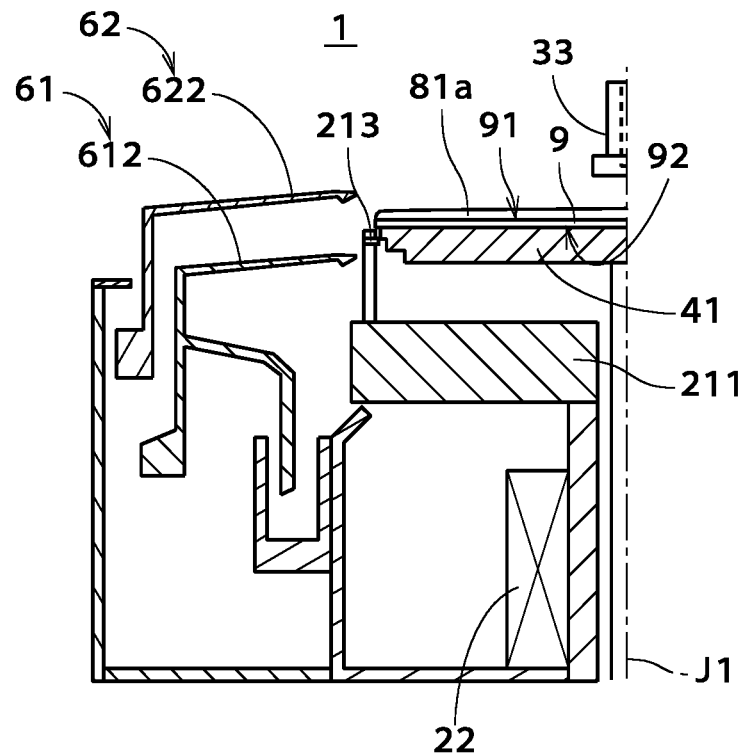
FIG. 7A is a view used for explaining an operation of the substrate processing apparatus.

After the gripping release state is formed, the heater 41 is moved from the lower position to the upper position, and as shown in FIG. 7A, the substrate 9 is passed from the plurality of support parts 213 to the upper surface of the heater 41. The substrate 9 is thereby supported by the heater 41 in the horizontal state, and the lower surface 92 of the substrate 9 is quickly heated by the heater 41. The substrate 9 is heated to have a temperature not lower than the boiling point of the organic solvent. When the liquid film 81a of the organic solvent receives heat from the upper surface 91 of the substrate 9, part of the liquid film 81a (i.e., a portion in contact with the upper surface 91) is vaporized in an interface with the upper surface 91. As a result, as shown in the second from the left of FIG. 6, a vapor layer 82a of the organic solvent is formed between the upper surface 91 and the liquid film 81a of the organic solvent (Step S19). At that time, if extraneous matters (extraneous matters which are not removed in the above Step S17) remain on the pattern elements 93 and the upper surface 91 of the substrate 9, the extraneous matters are taken in the liquid film 81a of the organic solvent and floated from the upper surface 91 together with the liquid film 81a. For example, the thickness of the vapor layer 82a is larger than the height of the pattern element 93 and the whole of the pattern elements 93 is included in the vapor layer 82a.

Figure 7B:
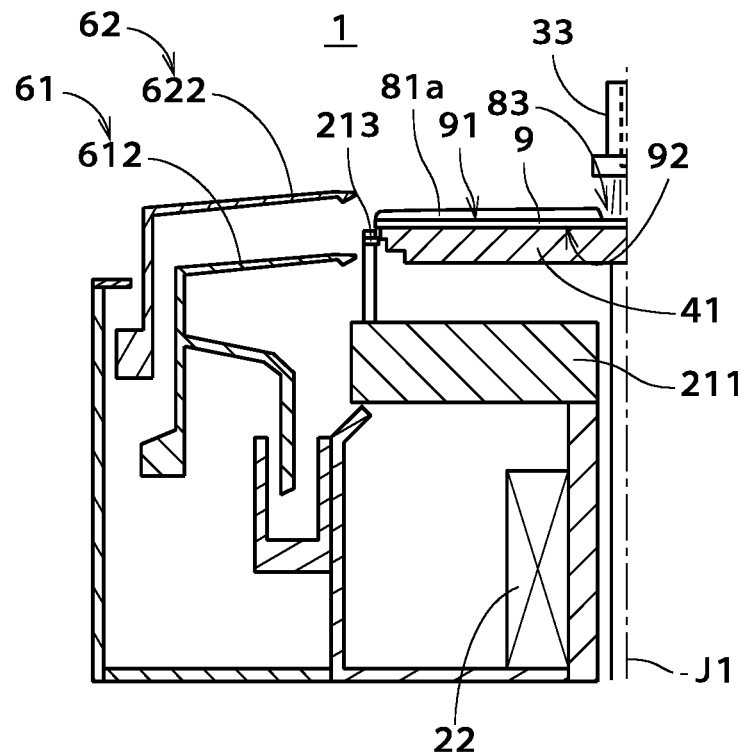
FIG. 7B is a view used for explaining the operation of the substrate processing apparatus.

In the substrate processing apparatus 1, the heating time required to form the vapor layer 82a entirely over the upper surface 91 is obtained in advance. After the heating time has elapsed, by opening the on-off valve 342, the inert gas supply source 341 supplies the inert gas to the third nozzle 33, and as shown in FIG. 7B, the inert gas is thereby injected toward the center portion of the liquid film 81a (the center portion of the upper surface 91) from the third nozzle 33 at a first flow rate. As shown in the third from the left of FIG. 6, a hole 83 which penetrates the liquid film 81a in the center portion of the liquid film 81a is thereby formed (Step S20).

Figure 7C:
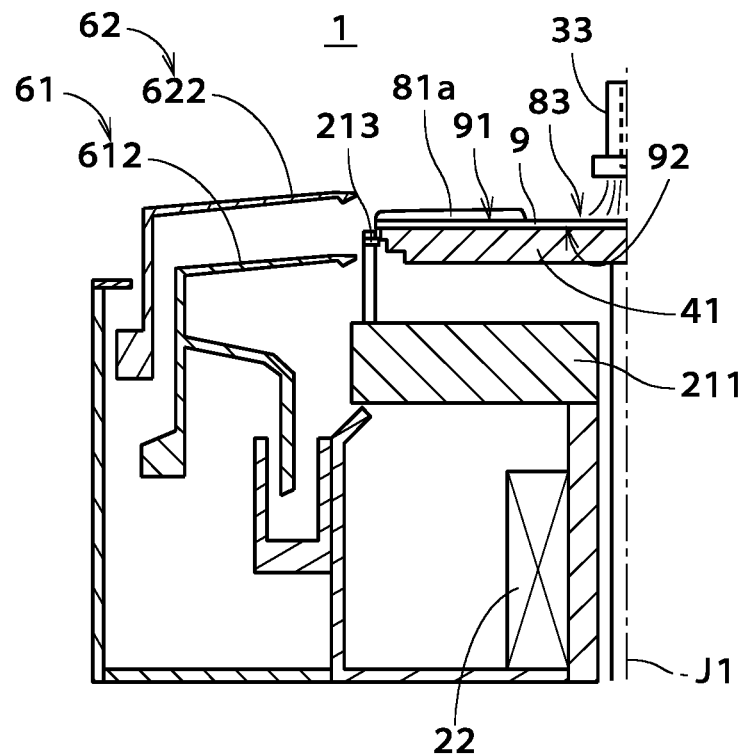
FIG. 7C is a view used for explaining the operation of the substrate processing apparatus.

At that time, the substrate 9 is continuously heated by the heater 41, and as shown on the rightmost side of FIG. 6, the hole 83 is widened outward in the radial direction, and in other words, the diameter of the hole 83 is gradually increased. Further, in the flow rate regulating valve 343, the flow rate of the inert gas is gradually (herein, step by step) increased. Specifically, from the third nozzle 33, the inert gas is injected toward the hole 83 at a second flow rate higher than the first flow rate, and after that, the inert gas is injected toward the hole 83 at a third flow rate higher than the second flow rate. As shown in FIG. 7C, the hole 83 formed in the liquid film 81a is further widened outward in the radial direction. In other words, the inner diameter of the liquid film 81a which is annularly continuous is gradually increased. Further, with the increase in the flow rate of the inert gas, the position of the third nozzle 33 in the up-and-down direction may be changed by the nozzle moving mechanism (for example, can be made closer to the upper surface 91 of the substrate 9).

Figure 7D:
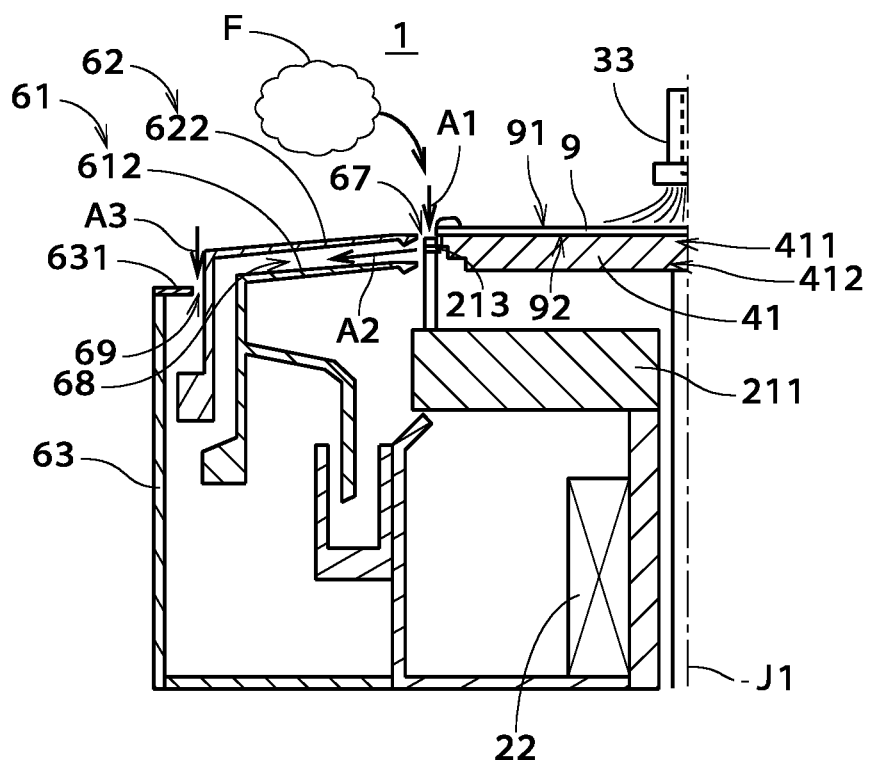
FIG. 7D is a view used for explaining the operation of the substrate processing apparatus.

In the cup part 6, concurrently with the increase in the flow rate of the inert gas, the outer guard 62 is moved downward by the guard up-and-down moving mechanism 66. As shown in FIG. 7D, the outer top cover 622 is thereby placed at a position lower than the upper surface 91 of the substrate 9 and upward away from the inner top cover 612 (Step S21). In the exemplary case shown in FIG. 7D, the above-described position is a position where the inner peripheral edge of the outer top cover 622 faces a side surface of the heater upper portion 411 in the radial direction and hereinafter referred to as a "heater upper portion facing position". By placing the outer top cover 622 at the heater upper portion facing position, an annular gap 67 is formed between the inner peripheral edge of the outer top cover 622 and the side surface of the heater upper portion 411.

The heater upper portion facing position is a position where a vertical distance between the inner peripheral edge of the outer top cover 622 and the upper surface 91 of the substrate 9 is, for example, shorter than 4 mm, and preferably, a position where the vertical distance is 1 to 3 mm. In the exemplary case shown in FIG. 7D, the inner peripheral edge of the inner top cover 612 is disposed lower than the side surface of the heater 41 which extends downward from the outer peripheral edge of the upper surface of the heater 41, and in more detail, is disposed at a position where the inner peripheral edge of the inner top cover 612 faces a side surface of the heater lower portion 412 in the radial direction. In the exhaust through the annular gap 67, it is thereby possible to suppress an increase in the pressure loss. In the state shown in FIG. 7D, the width (vertical width) of the guard exhaust space 68 between the outer top cover 622 and the inner top cover 612 downward away from the outer top cover 622 is smaller than the width thereof at the time when the organic solvent is supplied (see FIG. 5C).

As described earlier, in the exhaust part 71, the inside of the outermost peripheral wall 63 is exhausted and the atmosphere around the substrate 9 is exhausted through the inside of the inner guard 61, the guard exhaust space 68, and the outermost exhaust gap 69. In more detail, the inner peripheral edge of the outer top cover 622 is disposed at the heater upper portion facing position, and as indicated by the arrow A1 in FIG. 7D, the atmosphere around the substrate 9 is thereby exhausted at a position near the substrate 9 in the up-and-down direction (through the above-described annular gap 67). The inert gas injected from the third nozzle 33 thereby becomes easier to flow along the upper surface 91 in the vicinity of the upper surface 91 of the substrate 9 and it becomes possible to appropriately widen the hole 83 in the liquid film 81a. Further, it becomes possible to efficiently suck the atmosphere containing mist-like or gas-like extraneous matters (atmosphere F which is abstractly shown in FIG. 7D) in the vicinity of the outer peripheral edge of the substrate 9 and efficiently remove the organic solvent in the vicinity of the outer peripheral edge from the upper surface 91.

Further, since the width of the guard exhaust space 68 is relatively small, as indicated by the arrow A2 in FIG. 7D, it becomes possible to draw the organic solvent diagonally downward from the outer peripheral edge of the substrate 9 and efficiently remove the organic solvent from the upper surface 91. Furthermore, as indicated by the arrow A3 in FIG. 7D, a space above the outermost exhaust gap 69 is exhausted through the outermost exhaust gap 69 provided around the outer guard 62. At that time, since the whole of the outer top cover 622 is disposed lower than the upper surface 91 of the substrate 9, it becomes possible to suppress the organic solvent, the extraneous matters, or the like from spreading in a space above the substrate 9 due to an effect of the exhaust from the outermost exhaust gap 69. In the exhaust part 71 (see FIG. 1), since the exhaust flow rate is increased from the already-described normal exhaust flow rate as the flow rate of the inert gas is increased, it is possible to more reliably prevent or suppress contamination of the upper surface 91 due to deposition of the mist-like or gas-like extraneous matters contained in the atmosphere around the substrate 9 on the upper surface 91 of the substrate 9.

In the substrate processing apparatus 1, since the injection of the inert gas continues, the hole 83 in the liquid film 81a is widened up to the outer peripheral edge of the substrate 9 and the liquid film 81a is thereby removed from the upper surface 91 (Step S22). As described earlier, since the inside of the outermost peripheral wall 63 is exhausted by the exhaust part 71 concurrently with the injection of the inert gas, the removal of the liquid film 81a in the vicinity of the outer peripheral edge of the substrate 9 is promoted.

After that, the heater 41 is moved from the upper position to the lower position, and the substrate 9 is thereby passed from the upper surface of the heater 41 to the plurality of support parts 213. Further, the heating of the substrate 9 by the heater 41 is brought into the OFF state. The grippers in the plurality of support parts 213 are pressed against the outer peripheral end surface of the substrate 9, and the substrate gripping state is thereby formed. Furthermore, the outer guard 62 is moved upward, and the outer guard 62 thereby directly faces the substrate 9 in the radial direction (see FIG. 5D). Then, the substrate rotating mechanism 22 rotates the substrate 9 and the base part 211, and the organic solvent deposited on the base part 211 and the plurality of chuck pins 212 is thereby removed. In other words, the base part 211 or the like is dried (Step S23). At that time, since the injection of the inert gas toward the upper surface 91 of the substrate 9 continues from Step S20, it is possible to prevent or suppress the organic solvent spattering from the base part 211 or the like from splashing back from the cup part 6 and being deposited onto the upper surface 91 of the substrate 9.

After the rotation of the substrate 9 and the base part 211 has continued for a predetermined time, the rotation is stopped. The injection of the inert gas from the third nozzle 33 is also stopped and the third nozzle 33 is moved to the waiting position. Further, the inner guard 61 is placed to the lower position and the outer guard 62 is also placed to the lower position. Then, after the plurality of grippers are separated from the outer peripheral end surface of the substrate 9 (in the gripping release state), the substrate 9 is unloaded to the outside of the substrate processing apparatus 1 by the external transfer mechanism (Step S24). After that, the exhaust part 71 is stopped (Step S25). As described earlier, during operation of the substrate processing apparatus 1, the exhaust part 71 may be always driven. Thus, the processing of the substrate 9 in the substrate processing apparatus 1 is completed.

Figure 8:
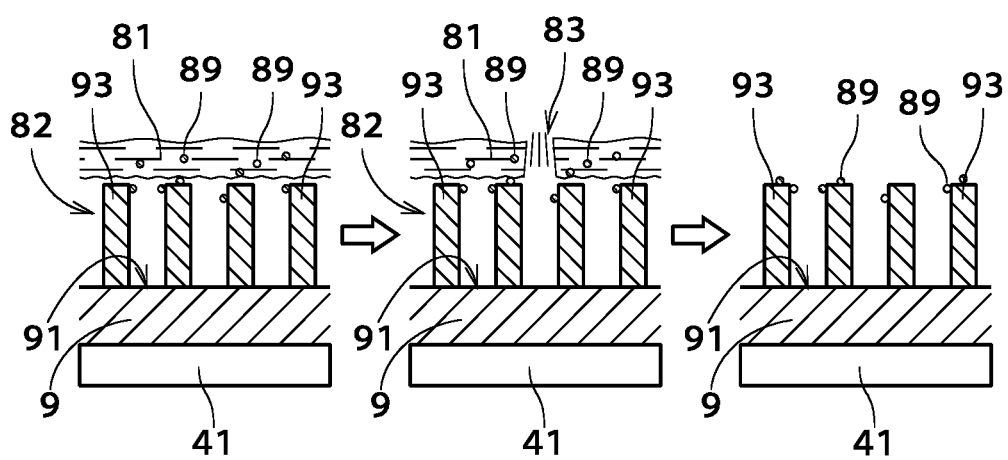
FIG. 8 is a view schematically showing an upper surface of a substrate being processed in a comparative example.

Herein, described will be a processing in the comparative example in which Steps S17 to S19 in FIGS. 2A and 2B are omitted. In the processing of the comparative example, as shown on the leftmost side of FIG. 8, the vapor layer 82 of the organic solvent is formed between the upper surface 91 of the substrate 9 and the liquid film 81 of the organic solvent (the liquid film 81 containing the extraneous matters 89, i.e., the liquid film 81 of the organic solvent in which the extraneous matters 89 are dissolved or floated) (Step S16), and then, as shown in the second from the left of FIG. 8, by injecting the inert gas toward the center portion of the liquid film 81, the hole 83 which penetrates the liquid film 81 in the center portion of the liquid film 81 is formed (Step S20). Then, by continuously injecting the inert gas toward the hole 83, the hole 83 is widened outward in the radial direction and the liquid film 81 is thereby removed from the substrate 9 (Step S22). In this case, as shown on the rightmost side of FIG. 8, part of the extraneous matters 89 taken in the liquid film 81 is deposited on the pattern elements 93 or the like and remains on the upper surface 91 when the liquid film 81 is removed (the upper surface 91 is dried).

In contrast to this, in the substrate processing apparatus 1, after forming the vapor layer 82 of the organic solvent between the upper surface 91 of the substrate 9 and the liquid film 81 of the organic solvent (Steps S15 and S16), by supplying a new organic solvent onto the upper surface 91, the liquid film 81 of the organic solvent is removed from the upper surface 91 (Step S17). It is thereby possible to appropriately remove the extraneous matters 89 taken in the liquid film 81 of the organic solvent as the vapor layer 82 is formed, together with the liquid film 81 from the upper surface 91 of the substrate 9. Further, by rotating the substrate 9 while supplying the new organic solvent, it is possible to efficiently remove the liquid film 81 containing the extraneous matters 89 from the upper surface 91. Furthermore, depending on the flow rate of the new organic solvent supplied onto the substrate 9 from the third nozzle 33, or the like, the rotation of the substrate 9 may be omitted.

It can be also considered that in Step S17, the heating of the substrate 9 by the heater 41 continues (in other words, the heating of the substrate 9 is not brought into the OFF state) when the new organic solvent is supplied onto the upper surface 91 of the substrate 9. In this case, however, depending on the temperature of the organic solvent, since the center portion of the substrate 9 on which the organic solvent is directly supplied from the third nozzle 33 becomes relatively a low temperature and an outer peripheral portion of the substrate 9 becomes a high temperature, the substrate 9 is warped and it becomes harder to hold the organic solvent entirely over the upper surface 91. In other words, this causes a state where no organic solvent exists in a partial area of the upper surface 91 and there arises a possibility that the pattern elements 93 may collapse due to an effect of the surface tension of the organic solvent. Therefore, in order to more reliably prevent or suppress collapse of the pattern elements 93 when the organic solvent is supplied onto the upper surface 91, it is preferable that the heating of the substrate 9 should be in the OFF state (the same applies to Steps S15 and S18 in which the liquid film 81 and the liquid film 81a of the organic solvent are formed, respectively). Further, in a case where the new organic solvent supplied onto the substrate 9 in Step S17 has a relatively high temperature, since the warp of the substrate 9 is suppressed, the above-described problem does not arise even if the heating of the substrate 9 by the heater 41 continues.

In the above-described substrate processing, after removing the liquid film 81 by supplying the new organic solvent (Step S17), the liquid film 81a of the new organic solvent is formed (Step S18), and by heating the substrate 9 from the lower surface 92 side, the vapor layer 82a is formed between the upper surface 91 and the liquid film 81a (Step S19). Then, by injecting the inert gas, the hole 83 is formed in the center portion of the liquid film 81a (Step S20), and by further injecting the inert gas, the hole 83 is widened outward in the radial direction and the liquid film 81a is thereby removed (Step S22). It is thereby possible to further remove the extraneous matters from the upper surface 91 of the substrate 9 and prevent or suppress collapse of the pattern elements 93 due to an effect of the surface tension of the organic solvent in the drying process. Further, since the new organic solvent is supplied (the liquid film 81 of the organic solvent is removed) and subsequently the liquid film 81a of the new organic solvent is formed, the process of Steps S15 to S17 relating to the removal of the extraneous matters 89 and the above-described drying process can be efficiently performed.

In the substrate processing apparatus 1, in a period from the formation of the vapor layer 82a by heating the liquid film 81a to completion of the removal of the liquid film 81a, i.e., concurrently with Steps S19 to S22, the space inside the outer guard 62 in the radial direction is continuously exhausted (the same applies to the guard exhaust space 68). Further, before the formation of the vapor layer 82a, the outer guard 62 is placed at the position facing the substrate 9 in the radial direction on the outside of the substrate 9 in the radial direction. It is thereby possible to appropriately exhaust the atmosphere of the organic solvent generated in the formation of the vapor layer 82a from around the substrate 9 and prevent or suppress deposition of the mist-like or gas-like extraneous matters contained in the atmosphere of the organic solvent, on the substrate 9.

Further, in order to widen the hole 83 in the liquid film 81a (in other words, concurrently with Step S22), the outer guard 62 is moved downward and the outer top cover 622 is placed at the heater upper portion facing position lower than the upper surface 91 of the substrate 9 (Step S21). It is thereby possible to exhaust the atmosphere around the substrate 9 at a position near the substrate 9 in the up-and-down direction and further prevent or suppress deposition of the mist-like or gas-like extraneous matters on the substrate 9. Furthermore, before Step S19, the inner guard 61 is placed lower than the substrate 9 outside the substrate 9 in the radial direction, and in Step S21, the outer top cover 622 is placed at the position upward away from the inner top cover 612 of the inner guard 61. It thereby becomes possible to draw the organic solvent diagonally downward from the outer peripheral edge of the substrate 9 and efficiently remove the organic solvent from the upper surface 91. As a result, it is possible to both suppress the residue of the liquid film 81a and suppress the deposition of the extraneous matters when the liquid film 81a of the organic solvent is removed.

In the above-described substrate processing, in the removal of the liquid film 81a of the organic solvent (in other words, concurrently with Step S22), the flow rate of exhaust from the space inside the outer guard 62 in the radial direction is increased by the exhaust part 71. It is thereby possible to more reliably exhaust the atmosphere in the vicinity of the outer peripheral edge of the substrate 9 and further prevent or suppress deposition of the mist-like or gas-like extraneous matters contained in the atmosphere, on the substrate 9.

In the substrate processing apparatus 1 and the substrate processing method described above, various modifications can be made.

In the above-described preferred embodiment, by forming the liquid film 81 of the organic solvent which entirely covers the upper surface 91 of the substrate 9 and then forming the vapor layer 82 which is spread almost entirely over the upper surface 91 between the upper surface 91 and the liquid film 81, it is possible to collectively detach the extraneous matters from the whole of the upper surface 91, and depending on the design of the substrate processing apparatus 1, the vapor layer 82 may be formed on part of the upper surface 91.

The above-described Steps S15 to S17, i.e., the formation of the liquid film 81 of the organic solvent, the formation of the vapor layer 82 of the organic solvent, and the removal of the liquid film 81 by using the new organic solvent may be repeatedly performed. It is thereby possible to more reliably remove the extraneous matters deposited on the upper surface 91 of the substrate 9. Further, the process of the above-described Steps S15 to S17 may be performed independently of the above-described Steps S18 to S22 relating to drying of the substrate 9. In other words, the process of the above-described Steps S15 to S17, where the extraneous matters deposited on the upper surface 91 of the substrate 9 can be appropriately removed, may be performed for example, as a preprocess of the chemical liquid process or the like.

Though the organic solvent used for forming the liquid film 81 and the new organic solvent used for removing the liquid film 81 are the same type in the above-described preferred embodiment, the organic solvent and the new organic solvent may be different types. In other words, a first processing liquid used for forming the liquid film 81 and a second processing liquid used for removing the liquid film 81 may be different types. Thus, in the substrate processing apparatus 1, by supplying the first processing liquid onto the upper surface 91 of the substrate 9 held in the horizontal state, a liquid film 81 of the first processing liquid which entirely covers the upper surface 91 is formed. Further, by heating the substrate 9, a vapor layer of the first processing liquid is formed between the upper surface 91 and the liquid film of the first processing liquid on the upper surface 91. Then, by supplying the second processing liquid onto the upper surface 91 of the substrate 9, the liquid film of the first processing liquid is removed from the upper surface 91. It is thereby possible to appropriately remove the extraneous matters from the upper surface 91, which are taken in the liquid film of the first processing liquid as the vapor layer is formed. In the substrate processing apparatus 1, as the first processing liquid, any processing liquid (for example, pure water or the like) other than the organic solvent may be used. From the viewpoint of removing the liquid film 81, the second processing liquid is not limited to the organic solvent. Further, the processing in Step S18 may use any type of organic solvent which is different from the second processing liquid. Furthermore, the respective organic solvents used in Steps S17 and S18 may be different types.

In the heating part 4, the shape of the heater 41 may be changed as appropriate. Further, in the heating part 4, a heater using a lamp or the like may be provided. Depending on the structure of the heater, the ON/OFF of heating of the substrate 9 may be switched by the ON/OFF of the heater itself. The heating part 4 does not necessarily need to be disposed immediately below the substrate 9 but may be disposed diagonally below the substrate 9. Furthermore, only if the vapor layer can be formed between the liquid film of the processing liquid (the first processing liquid or the second processing liquid) and the upper surface 91 by heating the substrate 9, the heating part 4 may be disposed above or beside the substrate 9 other than on the lower surface 92 side of the substrate 9.

In the inner guard 61, the inner top cover 612 may have an annular disk-like shape extending inward in the radial direction and horizontally from the upper end of the inner sidewall 611. Similarly, in the outer guard 62, the outer top cover 622 may have an annular disk-like shape extending inward in the radial direction and horizontally from the upper end of the outer sidewall 621.

In Step S21, there may be a case where the heater 41 supporting the substrate 9 is moved upward and the outer top cover 622 is thereby disposed at the heater upper portion facing position. Thus, in Step S21, the outer guard 62 has only to be moved downward relative to the substrate 9.

The substrate to be processed in the substrate processing apparatus 1 is not limited to a semiconductor substrate, but a glass substrate or any other substrate may be used. Further, the shape of the substrate may be other than the disk-like shape.

The configurations in the above-discussed preferred embodiment and variations may be combined as appropriate only if those do not conflict with one another.

While the invention has been shown and described in detail, the foregoing description is in all aspects illustrative and not restrictive. It is therefore understood that numerous modifications and variations can be devised without departing from the scope of the invention.

REFERENCE SIGNS LIST

1 Substrate processing apparatus
3 Gas-liquid supply part
4 Heating part
9 Substrate
11 Control part
61 Inner guard
62 Outer guard
68 Guard exhaust space
81, 81a Liquid film
82, 82a Vapor layer
83 Hole (of liquid film)
91 Upper surface (of substrate)
92 Lower surface (of substrate)
611 Inner sidewall
612 Inner top cover
621 Outer sidewall
622 Outer top cover
S11 to S25 Step

The invention claimed is:

1. A substrate processing method for processing a substrate, comprising:
   a) forming a liquid film of a first processing liquid which entirely covers an upper surface of a substrate held in a horizontal state by supplying said first processing liquid onto said upper surface of said substrate;
   b) forming a vapor layer of said first processing liquid between said liquid film of said first processing liquid on said upper surface of said substrate and said upper surface by heating said substrate;
   c) removing said liquid film and said vapor layer of said first processing liquid from said upper surface of said substrate by supplying a second processing liquid onto said upper surface while heating of said substrate is in an OFF state;
   d) forming a liquid film of said second processing liquid which entirely covers said upper surface of said substrate after said operation c);
   e) forming a vapor layer between said upper surface of said substrate and said liquid film of said second processing liquid by heating said substrate to thereby vaporize a portion of said liquid film, which is in contact with said upper surface;
   f) forming a hole at a center portion of said liquid film of said second processing liquid on said vapor layer by injecting gas toward said center portion of said liquid film; and
   g) removing said liquid film of said second processing liquid from said substrate by injecting gas toward said hole to thereby widen said hole outward in a radial direction, wherein
   in said operation c), said vapor layer of said first processing liquid is extinguished, and a whole of pattern elements formed on said upper surface is included in said second processing liquid.

2. The substrate processing method according to claim 1, wherein
   in said operation b), said vapor layer is formed between said upper surface and said liquid film by heating said substrate to thereby vaporize a portion of said liquid film, which is in contact with said upper surface of said substrate.

3. The substrate processing method according to claim 1, wherein
   said liquid film of said first processing liquid is removed by rotating said substrate in said operation c).

4. The substrate processing method according to claim 1, wherein
   said first processing liquid used in said operation a) and said second processing liquid used in said operation c) are the same type.

5. The substrate processing method according to claim 1, wherein
   a first guard having a first sidewall which has a cylindrical shape surrounding a periphery of said substrate and a first top cover which has an annular disk-like shape extending inward in the radial direction of said first sidewall and upward from an upper end of said first sidewall or a first top cover which has an annular disk-like shape extending inward in the radial direction of said first sidewall and horizontally from an upper end of said first sidewall is disposed outside said substrate in the radial direction, and a second guard having a second sidewall which has a cylindrical shape surrounding said periphery of said substrate inside said first sidewall in the radial direction and a second top cover which has an annular disk-like shape extending inward in the radial direction of said second sidewall and upward from an upper end of said second sidewall on a lower side to said first top cover or a second top cover which has an annular disk-like shape extending inward in the radial direction of said second sidewall and horizontally from an upper end of said second sidewall is disposed outside said substrate in the radial direction,
   said substrate processing method further comprising:
   h) moving said first guard downward relative to said substrate, to thereby dispose said first top cover at a position lower than said upper surface of said substrate and upward away from said second top cover, concurrently with said operation g); and
   i) continuously exhausting a guard exhaust space which is a space between said first top cover and said second top cover positioned downward away from said first top cover, concurrently with said operations e) to h).

6. The substrate processing method according to claim 1, wherein
a guard having a sidewall which has a cylindrical shape surrounding a periphery of said substrate and a top cover which has an annular disk-like shape extending inward in the radial direction of said sidewall and upward from an upper end of said sidewall or a top cover which has an annular disk-like shape extending inward in the radial direction of said sidewall and horizontally from an upper end of said sidewall is disposed outside said substrate in the radial direction,
said substrate processing method further comprising:
h) moving said guard downward relative to said substrate, to thereby dispose said top cover at a position lower than said upper surface of said substrate, at which a vertical distance between an inner peripheral edge of said top cover and said upper surface of said substrate is shorter than 4 mm, concurrently with said operation g); and
i) continuously exhausting a space inside said guard in the radial direction, concurrently with said operations e) to h).

7. The substrate processing method according to claim 1, wherein
a guard having a sidewall which has a cylindrical shape surrounding a periphery of said substrate and a top cover which has an annular disk-like shape extending inward in the radial direction of said sidewall and upward from an upper end of said sidewall or a top cover which has an annular disk-like shape extending inward in the radial direction of said sidewall and horizontally from an upper end of said sidewall is disposed outside said substrate in the radial direction,
said substrate processing method further comprising:
h) moving said guard downward relative to said substrate, to thereby dispose said top cover lower than said upper surface of said substrate, concurrently with said operation g); and
i) continuously exhausting a space inside said guard in the radial direction, concurrently with said operations e) to h),
wherein the flow rate of exhaust from said space inside said guard in the radial direction is increased in said operation i), concurrently with said operation h).

8. The substrate processing method according to claim 1, wherein
in said operation b), by forming said vapor layer, extraneous matters deposited on the pattern elements formed on said upper surface and said upper surface are taken in said liquid film floated from said upper surface, and
in said operation c), said extraneous matters are removed from said upper surface together with said liquid film.

9. The substrate processing method according to claim 8, wherein
in said operation c), said extraneous matters are removed from said upper surface by replacing said liquid film containing said extraneous matter and said vapor layer with said second processing liquid and by entirely covering said upper surface with said second processing liquid.

10. The substrate processing method according to claim 1, wherein
in said operation c), heating of said substrate is brought into the OFF state by placing a heater at a lower position, said heater having an upper surface which extends entirely over a lower surface of said substrate and which directly faces said lower surface.

\* \* \* \* \*